United States Patent
Moens et al.

(10) Patent No.: US 7,709,889 B2
(45) Date of Patent: May 4, 2010

(54) SEMICONDUCTOR DEVICE WITH IMPROVED BREAKDOWN PROPERTIES AND MANUFACTURING METHOD THEREOF

(75) Inventors: Peter Moens, Zottegem (BE); Filip Bauwens, Loppem (BE); Joris Baele, Ghent (BE); Marnix Tack, Merelbeke (BE)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 325 days.

(21) Appl. No.: 11/828,973

(22) Filed: Jul. 26, 2007

(65) Prior Publication Data

US 2009/0014785 A1    Jan. 15, 2009

(30) Foreign Application Priority Data

Jul. 26, 2006    (EP)    .................................. 06015574

(51) Int. Cl.
*H01L 29/00*    (2006.01)

(52) U.S. Cl. .............................. 257/330; 257/E29.201; 257/E29.26; 257/333; 257/329; 257/E29.118; 257/E29.131; 257/E29.183; 257/E29.189; 257/E29.198; 257/E29.257; 257/E29.313; 257/E29.274; 257/E21.375; 257/E21.41; 257/E21.629; 257/E21.643; 257/E21.676; 257/E21.693; 438/270

(58) Field of Classification Search ........................ None
See application file for complete search history.

(56) References Cited

U.S. PATENT DOCUMENTS

| | | | |
|---|---|---|---|
| 4,914,058 A | | 4/1990 | Blanchard |
| 4,941,026 A | | 7/1990 | Temple |
| 2005/0269644 A1* | | 12/2005 | Brask et al. ................. 257/369 |

FOREIGN PATENT DOCUMENTS

| | | |
|---|---|---|
| DE | 10361697 | 8/2005 |
| EP | 1248300 | 10/2002 |
| JP | 07245400 | 9/1995 |
| JP | 5223255 | 8/2005 |

OTHER PUBLICATIONS

Yang,Xin, et al. "Tunable Oxide-Bypassed Trench Gate MOSFET; Breaking the Ideal Superjunction MOSFET Performance Line at Equal Column Width" IEEE Electron Device Letter, vol. 24, No. 11, Nov. 2003, pp. 704-706.

* cited by examiner

*Primary Examiner*—Minh-Loan T Tran
*Assistant Examiner*—Fei Fei Yeung Lopez
(74) *Attorney, Agent, or Firm*—Robert F. Hightower

(57) ABSTRACT

The present invention provides a semiconductor device (20) comprising a trench (5) formed in a semiconductor substrate formed of a stack (4) of layers (1,2,3), a layer (6) of a first, grown dielectric material covering sidewalls and bottom of the trench (5), the layer (6) including one or more notches (13) at the bottom of the trench (5) and one or more spacers (14) formed of a second, deposited dielectric material to fill the one or more notches (13) in the layer (6) formed of the first, grown dielectric material. The semiconductor device (20) according to the present invention shows improved breakdown voltage and on-resistance. The present invention furthermore provides a method for the manufacturing of such semiconductor devices (20).

25 Claims, 7 Drawing Sheets

SEMICONDUCTOR DEVICE WITH IMPROVED BREAKDOWN PROPERTIES AND MANUFACTURING METHOD THEREOF

CROSS-REFERENCE TO RELATED APPLICATIONS

This patent application claims the benefit of European patent application serial number 06015574.4, filed Jul. 26, 2006, which patent application is incorporated herein by reference in its entirety.

TECHNICAL FIELD OF THE INVENTION

The present invention relates to semiconductor devices with high breakdown voltage and a method for the manufacturing of such semiconductor devices.

BACKGROUND OF THE INVENTION

An important property of a semiconductor device is the breakdown voltage. There exists insulator breakdown and breakdown of p-n junctions.

The atoms in insulating materials have very tightly-bound electrons, resisting free electron flow very well. However, insulators cannot resist indefinite levels of voltage. With enough voltage applied, any insulating material will eventually succumb to the electrical "pressure" and electron flow will occur, called insulator breakdown.

Thickness of an insulating material plays a role in determining its breakdown voltage, otherwise known as dielectric strength. Specific dielectric strength is often listed in terms of MV per cm, but in practice it has been found that the relationship between breakdown voltage and thickness is not exactly linear.

Also the maximum reverse bias voltage that can be applied to a p-n diode is limited by breakdown, breakdown being characterised by the rapid increase of the current under reverse bias. The corresponding applied voltage is referred to as the breakdown voltage, i.e. that reverse voltage at which a semiconductor device changes its conductance characteristics.

The breakdown voltage is a key parameter of power devices. The breakdown of logic devices is equally important as one typically reduces the device dimensions without reducing the applied voltages, thereby increasing the internal electric field.

Furthermore, breakdown voltage is also an important parameter in trench isolation structures. In some cases, upon initial biasing of certain high voltage semiconductor devices, the devices may pass current at a voltage less than the designed breakdown voltage. Upon continued stress and passage of current, the breakdown voltage will then "walk out" to its design breakdown voltage. This unstable electrical isolation behaviour may be associated with high electric fields across conventional isolation trenches and/or avalanche breakdown at the corners of conventional trench isolation structures.

For semiconductor devices it is important that the breakdown voltage is as high as possible.

Another important property of a semiconductor device is the specific on-resistance.

The specific on-resistance of a semiconductor device is the output resistance when the device is in its fully "on" or conducting state. For semiconductor devices it is important that the specific on-resistance is as low as possible, in order to dissipate as little energy as possible.

An ideal high-voltage switch (MOSFET) should have no resistance in its "on state", when it conducts electricity. Conversely, in its "off state", it should block an infinitely high voltage and prevent any electrical current from flowing through it. In reality, this is impossible. Doubling the voltage blocking capability typically leads to an increase in the on-state resistance by a factor of five—a physical law often referred to as the silicon limit for performance.

In 'Temperature characteristics of a new 100V rated power MOSFET, VLMOS (Vertical LOCOS MOS)', proceedings of 2004 International Symposium on Power Semiconductor Devices & ICs, Kitakyushu, p. 463-466, Masahito Kodama et al. describe a 100V rated power MOSFET. Manufacturing of the device comprises making a shallow and a deep trench and using local oxidation of silicon (LOCOS) technology. A thick oxide is formed at the deep trench region and a thin oxide at the shallow trench region by an oxidation process. From device simulation, it was predicted that the VLMOS had a breakdown voltage of 113 V and a specific on-resistance of 51.3 m$\Omega \cdot$mm$^2$ at a gate voltage of 20V. The silicon limit value at the breakdown voltage of 113 V is 81.4 m$\Omega \cdot$mm$^2$ and thus, the specific on-resistance of the VLMOS can be less than the silicon limit.

In 'Tunable Oxide-Bypassed Trench Gate MOSFET: Breaking the Ideal Superjunction MOSFET performance Line at Equal Column Width', IEEE electron device letters, vol. 24(11), November 2003, Yang et al. describe a superjunction MOSFET power device which has a higher blocking capability and lower on-state resistance that breaks the conventional unipolar silicon limit. The superjunction device concept has been proven to have advantages of higher breakdown voltage and lower specific on-resistance for making unipolar devices. The tunable oxide-bypassed (TOB) structure is formed by etching deep trenches beside drift region followed by thick thermal oxide growth and heavily doped polysilicon deposition. Measurement results show a maximum breakdown voltage of 79V at 5V tuning voltage. It is also observed that the good tunable characteristic does not deteriorate leakage current. The corresponding specific on-resistance is measured to be 0.674 m$\Omega \cdot$mm$^2$ at a gate voltage of 20V without application of tuning voltage.

A disadvantage of the above-described devices is, that when growing the thick oxide in the trench, a notch can be formed at the bottom of the trench. Because of this, a higher electric field will occur at this position which can result in premature breakdown of the device.

SUMMARY OF THE INVENTION

It is an object of the present invention to provide a semiconductor device with good breakdown characteristics and a method for manufacturing such a semiconductor device.

The above objective is accomplished by a method and device according to the present invention.

In a first aspect according to the present invention, a semiconductor device is provided. The semiconductor device comprises:

a trench having sidewalls, a bottom and corners between sidewalls and bottom, a layer comprising a first dielectric material covering at least part of the sidewalls and at least part of the bottom of the trench, the layer including one or more notches at one or more corners of the trench, one or more spacers formed of a second dielectric material to fill the one or more notches in the layer comprising the first dielectric material.

The first dielectric may be a grown layer. The second dielectric may be a deposited layer.

According to an embodiment of the present invention the semiconductor device may have a first and a second main electrode, a control electrode and a vertical channel and may comprise:

a stack of doped layers lying in a plane, the trench being formed in the stack of doped layers in a direction substantially perpendicular to the plane of the stack of doped layers, the trench having a top inner wall and a bottom inner wall, the layer comprising the first dielectric material at the bottom inner wall of the trench, and the one or more spacers formed of the second dielectric material being located on top of at least part of the layer comprising the first dielectric material at the bottom inner wall of the trench.

The trench may have a depth and the depth of the trench is related to the required breakdown voltage $V_{bd}$. Typically, the depth of the trench may be between 1 μm and 25 μm, preferably between 5 μm and 15 μm, for a $V_{bd}$ between 20 and 250 V. According to particular embodiments of the invention, in order to reduce the area of the device, the trench may be as small as possible, but still it must be feasible to fill the trench with a suitable conductive material, e.g. polysilicon, for forming a control electrode, e.g. gate structure. Typical width/depth ratios may be between 1 and 1/20.

The semiconductor device may be a MOSFET transistor, a CMOS, BICMOS, Bipolar or SiGe BICMOS device, a vertical high-voltage (HV) bipolar device or to high-voltage capacitors. Alternatively, the device may be a trench isolation structure comprising a polysilicon bias voltage contact.

According to a preferred embodiment of the invention, the first and second main electrodes may be provided on a same side of the semiconductor device. According to other embodiments of the invention, the first and second main electrodes may be provided on an opposite side of the semiconductor device.

An advantage of the device according to embodiments of the invention is that it may comprise a higher breakdown voltage than the silicon limit and than devices comprising a thick grown dielectric, e.g. oxide, in a trench but not using spacers as in accordance with the present invention.

Preferably, the second, e.g. deposited, dielectric material may have a dielectric constant between 2 and 20.

According to embodiments of the invention, the first, e.g. grown, dielectric may comprise a first part at the top inner wall of the trench and a second part at the bottom inner wall of the trench, the first part being thinner than the second part. Preferably, the first part may have a dielectric constant between 4 and 20 and the second part may have a dielectric constant between 2 and 20. According to other embodiments, the first and second parts of the first, e.g. grown, dielectric may have a comparable thickness.

The first part of the first, e.g. grown, dielectric may have a thickness between 5 nm and 100 nm and may have a dielectric constant or k-value between 4 and 20. The second part of the first, e.g. grown, dielectric may have a thickness between 100 nm and 1500 nm and may have a dielectric constant or k-value between 2 and 20.

According to embodiments of the invention, the one or more spacers may have a height between 100 nm and 500 nm and a thickness between 20 nm and 100 nm.

The stack of doped layers may comprise a first doped layer, a second doped layer and a third doped layer.

According to embodiments of the invention, the vertical channel may be formed between the third doped layer and the first part of the first, e.g. grown dielectric of the trench.

The first doped layer and the second doped layer may be of a first conductivity type and the third doped layer may be of a second conductivity type, the first conductivity type being opposite to the second conductivity type.

The first doped layer may have a higher dopant concentration than the second doped layer.

According to embodiments of the invention, the semiconductor device may furthermore comprise a floating dot region at the bottom of the trench in the second doped layer. The presence of a floating p-dot region further increases the breakdown voltage. The implant dopant dose in the floating dot region may be between $3 \cdot 10^{12}$ cm$^{-2}$ and $9 \cdot 10^{12}$ cm$^{-2}$.

According to embodiments of the invention, the semiconductor device may furthermore comprise an insulating etch stop on top of the first part of the first, e.g. grown, dielectric. The insulating etch stop may comprise a nitride spacer on top of the first, grown dielectric. According to other embodiments, the semiconductor device may furthermore comprise a protective oxide spacer on top of the nitride spacer for guaranteeing that the first, e.g. grown, dielectric layer is protected during further processing of the semiconductor device and that no short-circuit occurs between the control electrode, e.g. gate, and a main electrode, e.g. source electrode during this further processing.

According to a preferred embodiment of the invention, the semiconductor device may be provided on top of a substrate. The substrate may comprise a stack of lowly doped layers on top of highly doped layers.

The semiconductor device may be a power MOSFET.

The semiconductor device may also be a power bipolar device comprising a gate node, a source and a drain.

According to specific examples, the power bipolar device may be a device in which the gate node formed by filling the trench with e.g. polysilicon is left floating, and the source and bulk nodes are not short-circuited. According to other specific examples, the power bipolar device may be a device in which the first part of the first, e.g. grown, dielectric layer has a thickness comparable to the second part of the first, e.g. grown, dielectric. For this device, the processing may be different. The gate (i.e. trench filled with polysilicon) may be left floating or may be contacted. The source and bulk nodes need not be short-circuited.

In a second aspect of the present invention, a method is provided for manufacturing a semiconductor device. The method comprises:

providing a trench in a semiconductor substrate, the trench having sidewalls, a bottom and corners between the sidewalls and the bottom, providing a layer comprising a first, e.g. grown, dielectric material on at least part of the sidewalls and at least part of the bottom of the trench, the layer including one or more notches at the bottom of the trench, providing one or more spacers formed of a second, e.g. deposited dielectric material to fill the one or more notches in the layer comprising the first, e.g. grown dielectric material.

According to an embodiment of the invention the semiconductor device may have a first and a second main electrode, a control electrode and a vertical channel and may comprise:

providing a stack of doped layers lying in a plane, and providing the trench in a direction substantially perpendicular to the plane of the stack of doped layers, the trench having a top inner wall and a bottom inner wall, providing the layer comprising the first, e.g. grown, dielectric material at the inner wall of the trench, and providing the one or more spacers formed of the second, e.g. deposited, dielectric material on top of at least part of the layer comprising the first, e.g. grown, dielectric material at the bottom inner wall of the trench.

An advantage of the method according to embodiments of the invention is that it allows to make semiconductor devices which may have a higher breakdown voltage than the silicon limit and than devices comprising a thick dielectric, e.g. oxide, grown in a trench and not using spacers, as known from the prior art.

Providing a layer comprising the first, e.g. grown dielectric material at the inner wall of the trench may comprise providing a first part of the first, e.g. grown, dielectric at the top inner wall of the trench and a second part of the first, e.g. grown dielectric at the bottom inner wall of the trench, the first part being thinner than the second part.

Providing a stack of doped layers may comprise:
providing a first doped layer of a first conductivity type,
providing a second doped layer of the first conductivity type, and
providing a third doped layer of a second conductivity type, the first conductivity type being opposite to the second conductivity type.

Providing a third doped layer may be performed by implanting a dopant of the second conductivity type in the second doped layer for creating a body region.

According to embodiments of the invention, the method may furthermore comprise providing a floating dot region at a bottom of the trench in the second doped layer.

According to embodiment of the invention, the method may furthermore comprise providing an insulating etch stop on top of the first part of the first, e.g. grown dielectric. Providing an insulating etch stop may comprise providing a nitride spacer on top of the layer comprising the first dielectric material. According to further embodiments providing an insulating etch stop may furthermore comprise providing a protective oxide spacer on top of the nitride spacer.

According to other embodiments of the invention, the method may furthermore comprise growing a protective oxide on top of the material that fills the trench, hence forming a small birds beak at a top region of first, e.g. grown dielectric which is deposited at the sidewalls of the trench.

According to a preferred embodiment, the method may furthermore comprise providing a second substrate underneath the semiconductor substrate. Providing a second substrate may comprise providing a stack of lowly doped layers on top of highly doped layers.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
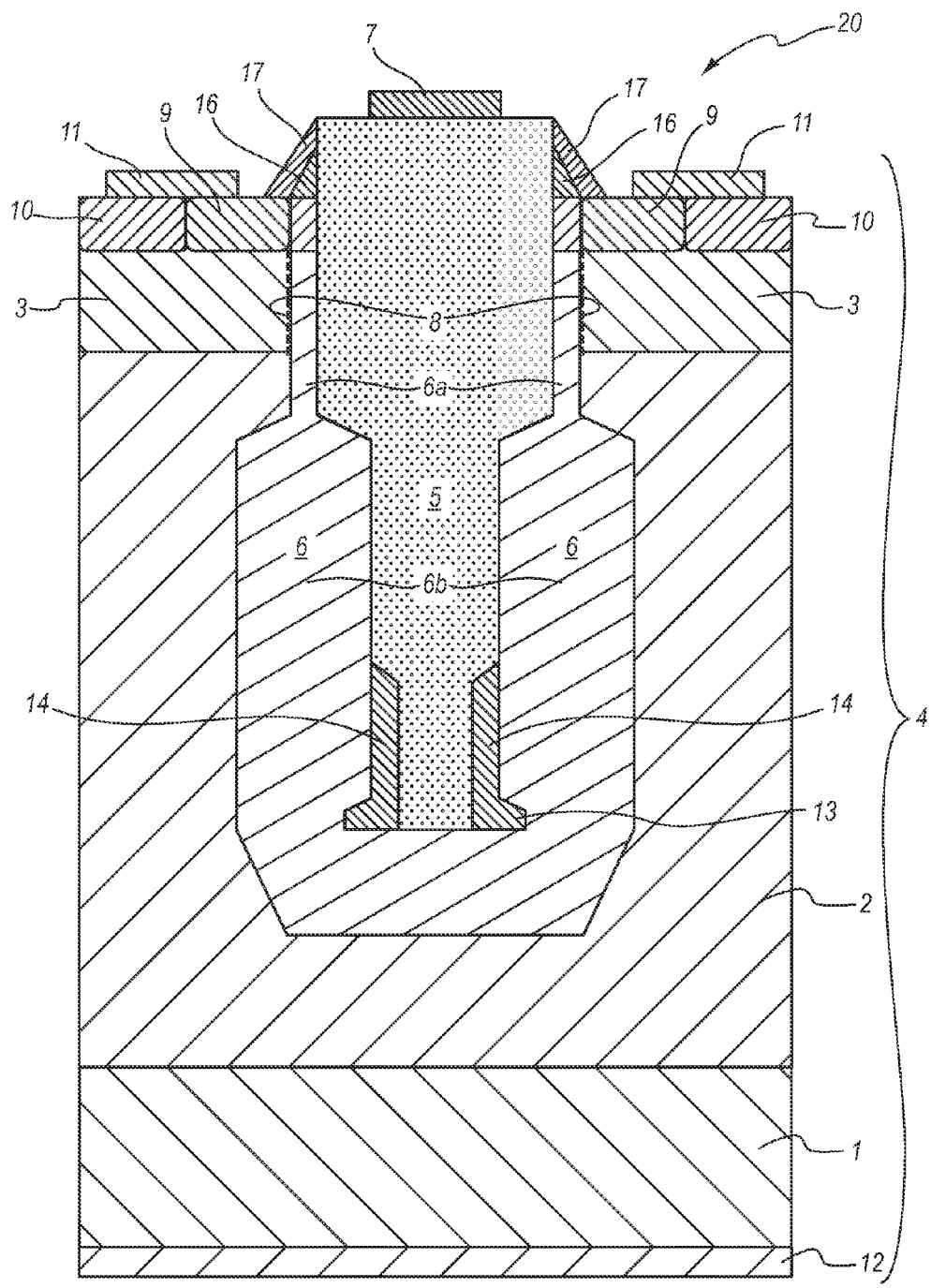
FIG. 1 illustrates a semiconductor device according to an embodiment of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

It will be clear for a person skilled in the art that the present invention is applicable in any semiconductor device having a thick layer of a dielectric material, such as e.g. an oxide, a nitrided oxide or a stack of thermally grown oxides, grown in a trench.

The present invention relates to a semiconductor device and a method for the manufacturing of such a semiconductor device.

In the detailed description, reference will be made to transistors as examples of devices in accordance with embodiments of the present invention, in particular to MOSFET transistors. The present invention is, however, also applicable to similar devices that can be configured in any transistor technology, including for example, but not limited thereto, CMOS, BICMOS, Bipolar and SiGe BICMOS technology. The present invention may also be applied to vertical high-voltage (HV) bipolar devices or to high-voltage capacitors. Furthermore, the invention may be applied to trench isolation structures comprising a poly-silicon bias voltage contact. Examples of trench isolation structures are described in U.S. Pat. No. 5,914,523 by Bashir et al.

Transistors are three-terminal devices having a first main electrode such as a drain, a second main electrode such as a source and a control electrode such as a gate for controlling the flow of electrical charges between the first and second main electrodes. According to embodiments of the present invention, the control electrode of the semiconductor device is formed in a vertical trench in a substrate. With vertical trench is meant that, if the substrate is lying in a plane, the trench is formed in the substrate in a direction substantially perpendicular to the plane of the substrate. The semiconductor device according to embodiments of the present invention furthermore comprises a vertical channel, i.e. if the substrate is lying in a plane, the channel is formed in a direction substantially perpendicular to the plane of the substrate, and thus in the same direction as the direction in which the trench is formed.

According to embodiments of the present invention, the semiconductor device may comprise a pair of spacers formed of a deposited dielectric material, e.g. nitride spacers at the bottom of the trench, one spacer, e.g. nitride spacer, being positioned at a first side of the trench and the other spacer, e.g. a nitride (k=7.8) or $HfO_2$ (k>15) spacer, being positioned at a second side of the trench, the first and second side being opposite to each other. Preferably, the dielectric material for forming the spacers may have a dielectric constant or k-value between 2 and 20.

According to embodiments of the present invention, the semiconductor device may preferably be a vertical power MOSFET (metal-oxide semiconductor field-effect transistor). Therefore, the present invention will further be discussed by reference to such a vertical power MOSFET. It has, however, to be understood that this is only as an example and that this is not intended to limit the invention in any way. The invention applies to any semiconductor device having a trench, a layer comprising a first, grown dielectric, e.g. an oxide, a nitrided oxide or a stack of grown oxides covering the sidewalls and the bottom of the trench, the layer comprising the first, grown dielectric material including one or more divots or notches at the bottom of the trench, and one or more spacers formed of a second, deposited dielectric material, e.g. nitride spacers, to fill the one or more divots or notches in the layer comprising the first, grown dielectric material, e.g. oxide layer or nitrided oxide layer. Preferably, the second, deposited dielectric material may have a dielectric constant or k-value between 2 and 20. Preferably, the dielectric constant may be as high as possible. This may be achieved by using a nitrided oxide with a k-value typically between 4 and 7.5 (depending on the nitride concentration) or by using a stack of thermally grown oxides.

In particular, embodiments of the present invention relate to semiconductor devices comprising a first and second main electrode, a control electrode formed in a vertical trench in a substrate and a vertical channel.

In FIG. 1 a semiconductor device 20 according to an embodiment of the present invention is illustrated, more particularly a vertical channel MOSFET transistor. It has to be noted that this is an example of a semiconductor device to be used in a discrete device, i.e. intended to be used as a single semiconductor device on a substrate or chip. In the further description, semiconductor devices intended to be used in integrated circuits will be described in further embodiments.

The semiconductor device 20 illustrated in FIG. 1 comprises a first doped layer 1 of a first conductivity type (i.e. n-type or p-type), the first doped layer 1 having a first, high dopant concentration which may typically be in the range between $10^{18}$ and $10^{19}$ cm$^{-3}$. The first doped layer 1 may have a thickness of between 50 µm and 500 µm, and preferably may have a thickness of about 350 µm. On top of the first doped layer 1 a second doped layer 2 is positioned, the second doped layer 2 is of the same first conductivity type (i.e. n-type or p-type) as the first doped layer 1, but has a second dopant concentration which is lower than the first dopant concentration. The thickness and the dopant concentration of the second doped layer 2 depends on the reverse blocking voltage or breakdown voltage $V_{bd}$ of the semiconductor device 20. The thickness of the second doped layer 2 may typically be in the range of between 2 µm and 15 µm and its dopant concentration may typically be between $10^{15}$ and $10^{17}$-cm$^{-3}$ for a reverse blocking voltage or breakdown voltage $V_{bd}$ of between 20 and 250V.

On top of the second doped layer 2 a third doped layer 3 is positioned, this third doped layer 3 having a second conductivity type (i.e. p-type or n-type) opposite to the first conductivity type of the first and second doped layers 1, 2. This third doped layer 3 has a third dopant concentration, which is higher than the second dopant concentration of the second doped layer 2 but generally lower than the first dopant concentration of the first doped layer 1, and which may typically be between $10^{16}$ and $10^{18}$ cm$^{-3}$. The thickness of the third doped layer 3 is preferably not larger than the length of the thin oxide 6a to be formed on upper side walls of the trench (see further). This is because, if the thickness of the third doped layer 3 would be such that the third doped layer 3 extends into the thick oxide 6b to be deposited on lower sidewalls of the trench (see further), the threshold voltage $V_{th}$ of the semiconductor device, e.g. transistor, would increase. This is not preferred because one wants to enable driving the control electrode with limited, low voltages which may typically be, for example, 3.3, 5, 12V or 18V. Preferably, the third doped layer 3 may have a thickness of between 0.5 µm and 2 µm.

In the further description, the first, second and third doped layer 1, 2, 3 will be referred to as a stack 4 of doped layers.

The semiconductor device 20 according to the present invention furthermore a comprises a trench 5 formed in the stack 4 of doped layers. The depth and width of the trench 5 depend on the thickness of the stack 4 of doped layers, on the voltage range of interest, on the required breakdown voltage and thus on the semiconductor device 20 that is manufactured. Typically, the depth of the trench 5 may be between 1 µm and 25 µm for a breakdown voltage between 20 and 250 V. In order to reduce the area of the semiconductor device, the width of the trench may preferably be kept as small as possible. However, it has to be kept in mind that it must still be feasible to fill the trench with a suitable material to form the control electrode, e.g. to fill the trench with polysilicon. Typical values for depth and width may respectively be 5 μm and 1.2 μm. Typically, the width/depth ratio of the trench 5 may be between 1 and 1/20.

The trench 5 is aligned with a first, grown dielectric material 6, e.g. an oxide or a nitrided oxide which is formed on an inner wall of the trench 5. Hereinafter the device 20 will further be described by means of the first, grown dielectric material 6 being an oxide 6. It has to be understood that this is not limiting the invention in any way.

The trench 5 is filled with a suitable conductive material (see further) to form the control electrode of the semiconductor device 20. According to an aspect of the present embodiment where the semiconductor device 20 is a power MOSFET, the control electrode is a gate. Therefore, according to this embodiment, the oxide 6 formed on the inner wall of the trench 5 can also be referred to as the gate oxide 6. The gate oxide 6 comprises two parts, i.e. a first part formed by a first oxide 6a at the top inner wall of the trench 5 and a second part formed by a second oxide 6b at the bottom inner wall of the trench 5. The first oxide 6a at the top inner wall of the trench 5 is thinner than the second oxide 6b formed at the bottom inner wall of the trench 5. Therefore, the first oxide 6a formed at the top inner wall of the trench 5 will be referred to as thin oxide 6a, in the example given thin gate oxide, and the second oxide 6b formed at the bottom inner wall of the trench 5 will be referred to as thick oxide 6b, in the example given thick gate oxide. The thin oxide 6a may have a thickness of between 5 nm and 100 nm and the thick oxide 6b may have a thickness of between 100 nm and 1500 nm.

As already mentioned, the trench 5 is filled with a suitable conductive material such as, for example, amorphous silicon or polysilicon which is preferably highly doped, i.e. with a dopant concentration between $10^{17}$ and $10^{19}$ cm$^{-3}$ and which may either be of the n- or p-type conductivity. The conductivity type of the material used for filling the trench 5 will determine the workfunction of that material. In this way, the threshold voltage of semiconductor device 20, in the example given the power MOSFET, can be tuned. The workfunction of the material the trench 5 is filled with, e.g. polysilicon, determines the threshold voltage of the transistor and is a prime transistor parameter. According to other embodiments of the invention, the trench 5 could also be filled with a metal such as e.g. Al, Cu, Ti, W.

The filled trench 5 forms a gate node and is contacted with a gate contact 7. At the border between the third doped layer 3 and the gate node, the semiconductor device 20 furthermore comprises a vertical channel 8 and thus the semiconductor device 20, in operation, allows a vertical current flow.

In the third doped layer 3 a first doped region 9 and a second doped region 10 are formed. The first doped region 9 is formed of a material having the same conductivity type as the first and second doped layers 1, 2, and of the conductivity type opposite to the third doped layer 3. The first doped region 9 is very highly doped, i.e. in the range of $10^{18}$-$10^{20}$ cm$^{-3}$ and forms source node 9. Typically, the dopant concentration of the first doped region 9 may be about $10^{19}$ cm$^{-3}$. The second doped region 10 is of the same conductivity type as the third doped layer 3, is also very highly doped, i.e. has a dopant concentration in the range of $10^{18}$-$10^{20}$ cm$^{-3}$ and forms bulk node 10. Typically, the dopant concentration of the second doped region 10 may be about $10^{19}$ cm$^{-3}$.

Typically, the first and second doped regions 9, 10 may be short-circuited by a conductive material such as a metal. This conductive material can be any suitable metal and serves as a first main electrode contact, e.g. source contact 11.

Furthermore, according to the present embodiment of the invention, a conductive material such as a metal may be provided at a bottom part of the first doped layer 1. This conductive material serves as a second main electrode contact, e.g. a drain contact 12.

Figure 2A:
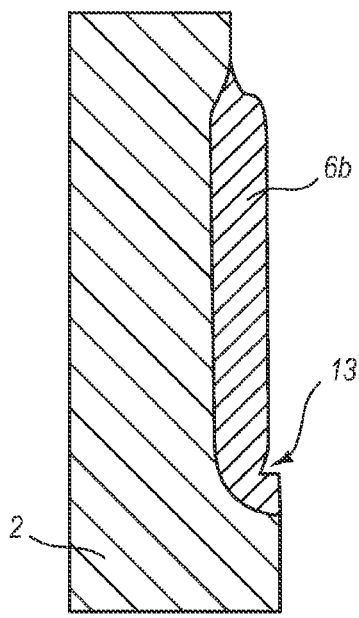
FIG. 2 shows the bottom nitride spacers of the device illustrated in FIG. 1.
Figure 2B:
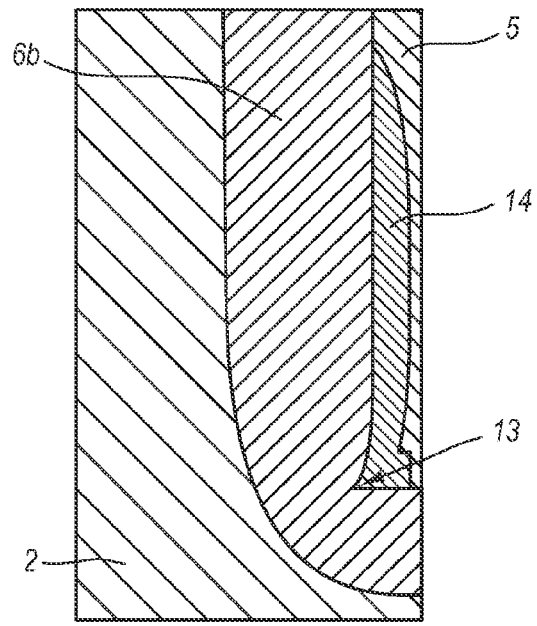

A specific problem that arises when growing the thick oxide 6b at the bottom part of the trench 5, is the occurrence of a notch 13 at the bottom of the thick oxide 6b, which is stress-related (see FIG. 2 and FIG. 3). A high electric field will occur at this position, which can result in premature breakdown of the semiconductor device 20 because the electric field in the semiconductor material, e.g. silicon, is related to the electric field in the insulating material, e.g. oxide 6, by Gauss' law for isotropic media at low frequencies. The formation of notches 13 thus lowers the breakdown voltage.

In order to increase the breakdown voltage $V_{bd}$ of the semiconductor device 20, according to the present invention, the device 20 comprises at least one spacer 14 formed of a deposited dielectric material preferably having a dielectric constant between 2 and 20, e.g. a nitride spacer. The spacers 14 are formed by depositing the dielectric material and not by growing dielectric material. The dielectric material to form the spacers 14 may be deposited by any suitable deposition technique known by a person skilled in the art, such as, for example, chemical vapour deposition (CVD). Advantageously, the dielectric constant or k-value of the second, deposited dielectric material is higher than the dielectric constant or k-value of the first, grown dielectric material. In this case, the improvement of breakdown voltage may be enhanced. The at least one spacer 14 is located at the bottom inner wall of the trench 5 and on top of the thick oxide 6b. The height of the spacer 14 may be between 100 nm and 500 nm. The thickness of the at least one spacer 14 may be in the range between 20 nm and 100 nm.

According to preferred embodiments of the invention, the first, grown dielectric may be an oxide and the second, deposited dielectric may be a nitride. FIG. 2 shows the result of a Technology Computer-Aided Design (TCAD) computer simulation of a nitride spacer 14 deposited on top of an oxide layer 6b which is grown at the bottom inner wall of the trench 5. As already mentioned above, because nitride has a higher dielectric constant ∈ than oxide, the improvement of the breakdown voltage will be even more enhanced.

Figure 3A:
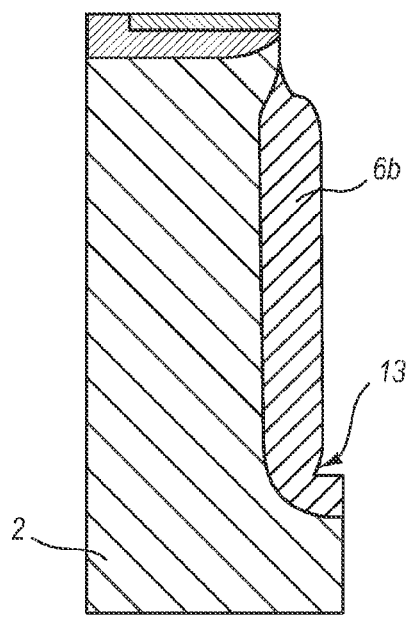
FIG. 3 illustrates the impact ionisation at breakdown of a structure without nitride spacers (FIG. 3(a)) and with nitride spacers according to embodiments of the present invention (FIG. 3(b)).
Figure 3B:
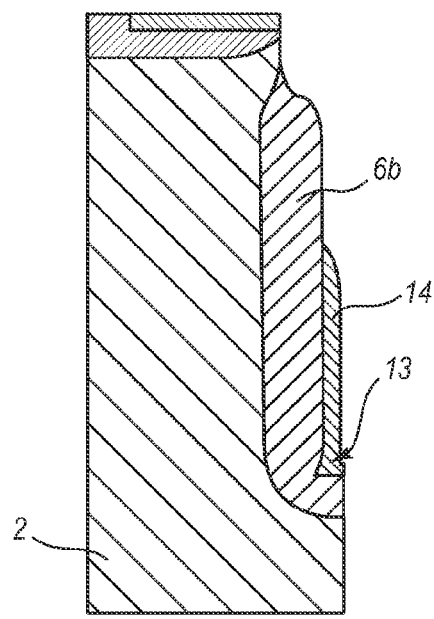

FIG. 3 shows the impact ionisation, i.e. generation of electron-hole pairs in semiconductor due to a collision of high kinetic energy species with an atom in a lattice, of two similar structures at breakdown. FIG. 3(a) illustrates the impact ionisation for a structure without a spacer 14, FIG. 3(b) illustrates the impact ionisation for a structure with a spacer 14, in the example given a nitride spacer, in accordance with embodiments of the present invention. In the latter case, the impact ionisation is not occurring any longer at the notch 13 and thus a higher breakdown voltage $V_{bd}$ can be expected. The resulting breakdown voltage $V_{bd}$ is 128 V for the case without a spacer 14. According to the present invention, i.e. for the power MOSFET comprising a nitride spacer 14 according to the present embodiment of the invention, however, the resulting breakdown voltage $V_{bd}$, measured at $V_{1st\ main\ electrode} = V_{control\ electrode}$ 0V (=off-state), is 151 V which corresponds to a gain of 18% with respect to the device without the spacer 14.

A way to further increase the breakdown voltage $V_{bd}$ of the semiconductor device 20 is to implant a floating region with the second conductivity type, e.g. a p-dot region 15 in the second doped layer 2 under a bottom part of the trench 5.

Figure 4A:
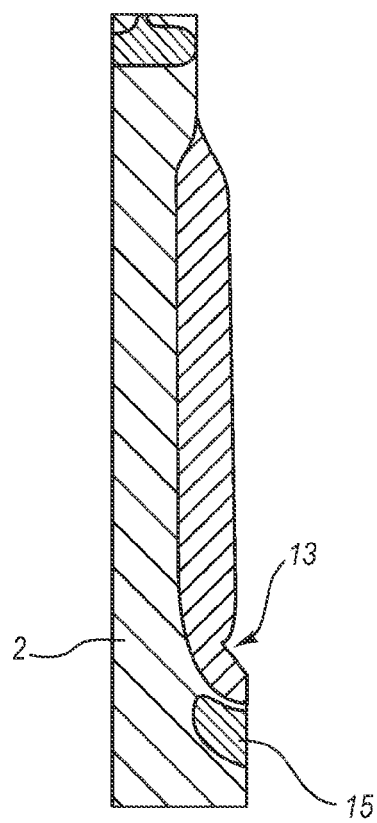
FIG. 4(a) shows a structure with a p-dot implanted at the bottom of the trench.
Figure 4B:
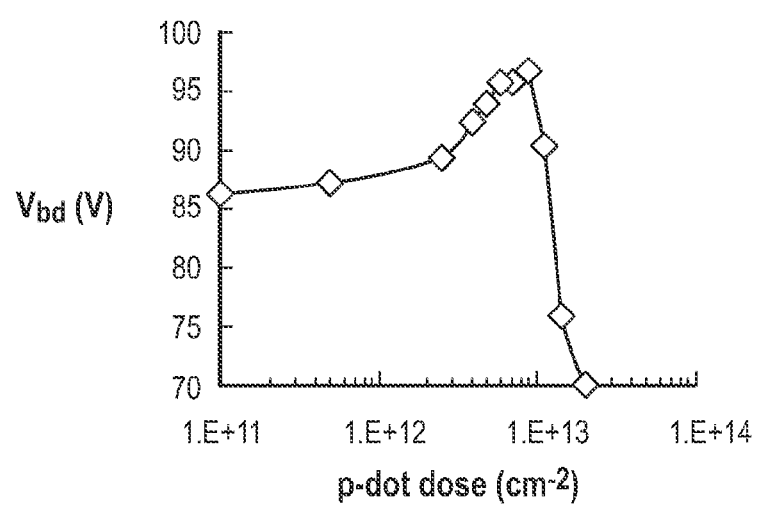
FIG. 4(b) shows the improvement in breakdown voltage for different p-dot implantation doses.

Upon reverse biasing, this floating p-dot region 15 will be depleted first, and will relax the potential lines in the semiconductor material, e.g. silicon present in the trench 5 and thus will result in a higher breakdown voltage $V_{bd}$. FIG. 4(*a*) shows part of a structure with a floating p-dot region 15 implanted under the bottom part of the trench 5. FIG. 4 (*b*) shows the improvement in breakdown voltage $V_{bd}$ as a function of the implant dose of the floating p-dot region 15. In the floating p-dot region 15 a dopant concentration in the range between $10^{15}$ and $10^{17}$ cm$^{-3}$ can be obtained, resulting from an implant dose in the range $10^{11}$ to $10^{13}$ cm$^{-2}$. This implant dose depends on the dopant concentration of the second doped layer 2 because when the dopant concentration of the second doped layer 2 increases, the implant dose of the p-dot region 15 needs to be increased, to keep the net concentration (the p-dot implant and the second doped layer 2 have an opposite conductivity type) of the floating p-dot region 15 high enough to fulfil its role. It can be seen from FIG. 4(*b*) that the highest breakdown voltages, i.e. between about 93V and 97V can be obtained at an implantation dose for the floating p-dot region 15 between $3 \cdot 10^{12}$ and $9 \cdot 10^{12}$ cm$^{-2}$.

The semiconductor device 20 according to the present invention may furthermore comprise a nitride spacer 16 and/or an oxide spacer 17 on top of the thin oxide 6*a*, the spacers 16, 17 functioning as an insulating etch stop. The nitride spacer 16 may be required during the manufacturing of the device 20 for protecting the thin oxide 6*a* on the top inner wall of the trench from being etched. The oxide spacer 17 may be required for protecting the nitride spacer 16 in the further processing of the semiconductor device 20. The nitride and/or oxide spacers 16, 17 are self-aligned to the gate node or trench 5. According to embodiments of the present invention, a nitride spacer 16 could be sufficient to protect the thin oxide 6*a* from being etched if no further nitride etches are performed in the subsequent processing of the semiconductor device 20. However, for a semiconductor device 20 to be integrated in a smart power technology, the standard CMOS active area process module can be processed after the device definition. Hence, in this case the additional oxide spacer 17 is required to protect the nitride spacer 16 from being attacked during the active area nitride etch.

The presence of the nitride spacer 16 and/or an oxide spacer 17 make sure that no short-circuits are created between the control electrode, e.g. gate, and a main electrode, e.g. source, in the further processing of the semiconductor device, for example during a salicidation step to form low-ohmic connections, known by a person skilled in the art.

Figure 5:
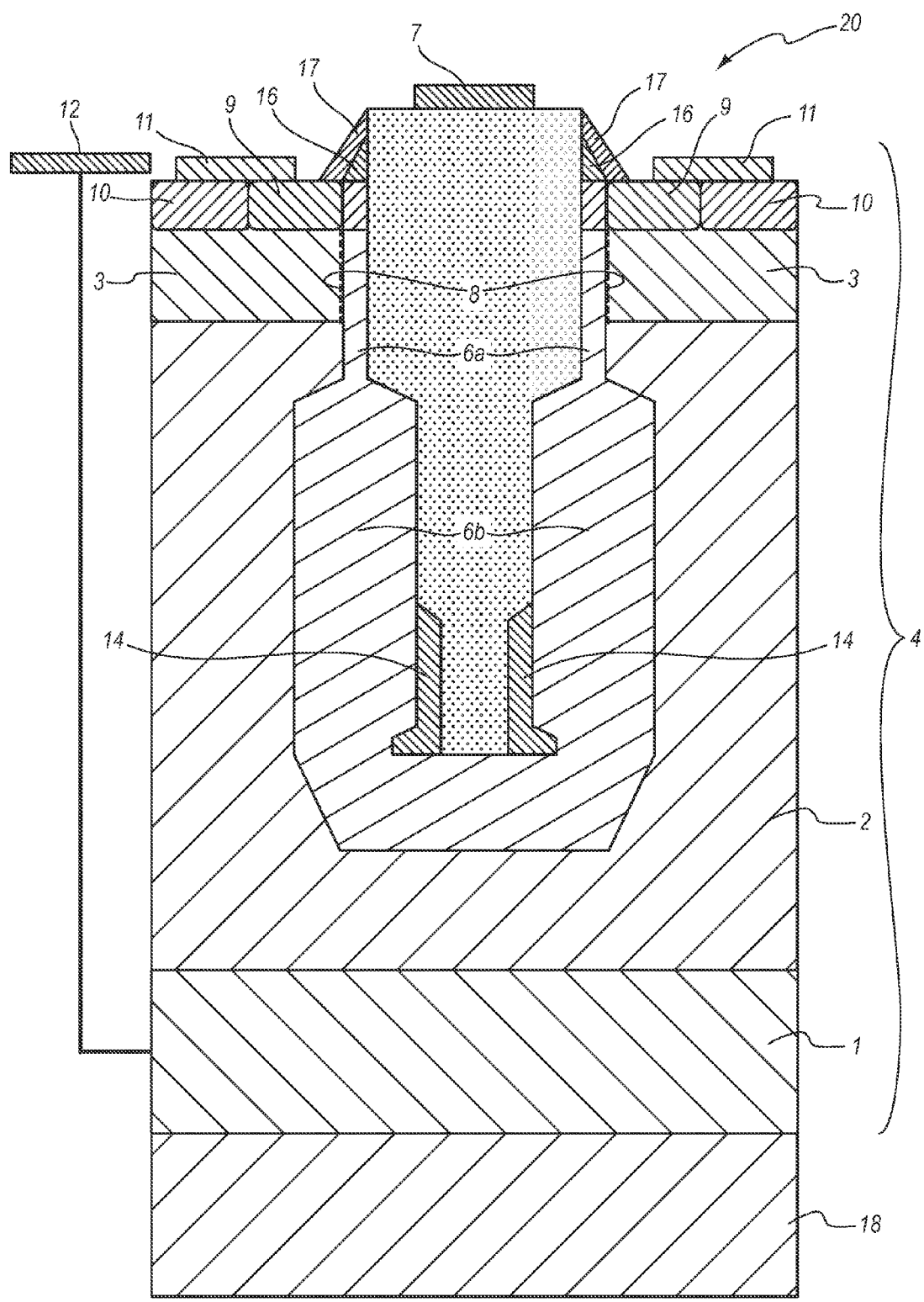
FIG. 5 diagrammatically illustrates a semiconductor device according to an embodiment of the present invention for integration in a smart power technology.

Hereinafter, according to preferred embodiments of the invention, a semiconductor device 20 will be described which is intended to be used in integrated circuits. FIG. 5 illustrates a semiconductor device 20 according to an embodiment of the present invention for integration in a smart power technology. Smart power technologies are preferred choices for mixed analog-digital and power applications. They combine bipolar analog devices, CMOS logics and high voltage DMOS. According to the embodiment of FIG. 5, the oxide spacer 17 may be formed by oxidation of the nitride spacer 16, hereby forming oxynitride. The oxynitride on top of the nitride spacer 16 may be sufficient to act as an etch stop layer.

According to the present embodiment, the semiconductor device 20 may furthermore comprise a substrate 18 at a bottom part of the first doped layer 1, or in other words the substrate 18 may be formed underneath the stack 4 of doped layers. According to these preferred embodiments, the first doped layer 1 has the function of a buried layer. According to these embodiments, the first doped layer or buried layer 1 may have a thickness of between 2 and 10 μm. The substrate 18 may be of a conductivity type opposite to the conductivity type of first and second doped layers 1, 2. The substrate 18 may be lowly doped, i.e. with a dopant concentration between $10^{14}$ and $10^{17}$ cm$^{-3}$, or highly doped, i.e. with a dopant concentration between $10^{18}$-$10^{19}$ cm$^{-3}$. Preferably the substrate 18 may in itself be a stack of lowly doped layers on top of highly doped layers. The lowly doped layers may serve to achieve a high enough breakdown voltage $V_{bd}$ towards the substrate. This is because the substrate 18 can be at a different potential compared to the first doped layer 1. For example, $V_{substrate}=0V=$ground and $V_{layer1}=100V$. In this case, there is a need for a lightly doped layer in the substrate 18 to build up depletion. The highly doped layers may serve to achieve good latch-up immunity.

According to these preferred embodiments, the first main electrode contact, e.g. a drain contact 12, of the semiconductor device 20, is contacted by sinkers (not shown on figure) that extend between buried layer 1 and the surface of the semiconductor substrate 4 in which the device is built. Hence, in the semiconductor devices 20 according to these preferred embodiments, the first main electrode, e.g. drain contact 12, is located at a same side of the semiconductor device 20 as the second main electrode, e.g. source contact 11.

The device 20 according to the present invention has the advantage that the breakdown voltage is increased. This is because the spacers 14 relax the higher electric field caused by the notches 13 in the first, grown dielectric 6, i.e. the presence of the spacers 14 locally reduces the electric stress on the first, grown dielectric 6.

Hereinafter, a method for the manufacturing of a semiconductor device 20 according to an embodiment of the present invention will be described. According to this embodiment, the semiconductor device 20 may for example be an n-type integrated power MOSFET. It has to be understood that this is only an example and that other process sequences which can be used to obtain the semiconductor device 20 according to embodiments of the present invention are also part of the invention. It should furthermore be clear to a person skilled in the art that the method according to the present invention can also be used for the manufacturing of other semiconductor devices comprising a trench, e.g. a deep trench, an oxide layer covering the sidewalls and the bottom of the trench, the oxide layer including one or more notches at the bottom of the trench, and one or more nitride spacers. Steps may be provided to form from such devices transistor devices such as e.g. a p-type MOSFET or any other semiconductor device 20 comprising a first and second main electrode, a control electrode, a vertical trench structure and a vertical channel. However, the invention is not limited thereto.

The method of manufacturing the n-type integrated power MOSFET according to the present embodiment is schematically illustrated in FIG. 6 to 11. It has to noted that the method may also apply for the manufacturing of a p-type power MOSFET by simply changing n-type by p-type and vice versa in the following description of the manufacturing process.

In a first step, a p-type substrate 18, is provided. The p-type substrate 18 may preferably be a silicon substrate, but any other suitable semiconductor device may also be used to form the substrate 18. The substrate 18 may be highly doped, i.e. with a dopant concentration between $10^{18}$-$10^{19}$ cm$^{-3}$, or lowly doped, i.e. with a dopant concentration between $10^{14}$ and $10^{17}$ cm$^{-3}$. According to a preferred embodiment of the present invention, the substrate 18 may be a stack of lowly doped p-type layers on top of highly doped p-type layers.

In a next step, a first doped layer 1 may be deposited on top of the substrate 18. The first doped layer 1 may, according to the present embodiment, be a highly doped, and thus lowresistive n-type layer. The first doped layer 1 may be deposited or grown using any suitable technique known by a person skilled in the art. The first doped layer 1 has a dopant concentration which may typically be in the range between $10^{18}$ and $10^{19}$ cm$^{-3}$. The first doped layer 1 may have a thickness of between 2 µm and 10 µm.

On top of the first doped layer 1, a second doped n-type layer 2 may be deposited. The second doped layer 2 may be a lower doped n-type epi layer with a kind of dopant and a dopant concentration dependent on the voltage range of interest. Typically the second doped layer 2 may have a thickness between 2 µm and 15 µm and may have a dopant concentration between $10^{15}$ and $10^{17}$ cm$^{-3}$ for a breakdown voltage $V_{bd}$ between 20 and 250 V.

In a subsequent step, a thin pad oxide 21 is grown on top of the second doped layer 2. The thin pad oxide 21 may typically have a thickness around 20 nm. A nitride layer 22 is then deposited on top of the pad oxide 21. The nitride layer 22 may have a thickness between 100 nm and 600 nm. Next, a thick oxide layer 23 is deposited on top of the nitride layer 22. The thick oxide layer 23 may have a thickness between 500 nm and 3000 nm. In a next step, the layer stack formed by the thin pad oxide 21, the nitride layer 22 and the thick oxide layer 23, may be patterned by using any suitable lithographic technique, e.g. using a photoresist mask (not illustrated). Subsequently a trench 5 may be formed in the exposed part of the second doped layer 2, i.e. in that part of the second doped layer 2 that is not covered by the patterned stack of layers. This may be done by a first etch of the second doped layer 2 through the opening of the patterned stack of layers. The first etch may, for example, be a wet or a dry anisotropic etch. The depth and width of the trench 5 depend on the voltage range of interest and thus on the semiconductor device 20 that is manufactured. Typical values for depth and width of the trench 5 at this stage of the process may respectively be 5 µm and 1.2 µm.

Figure 6:
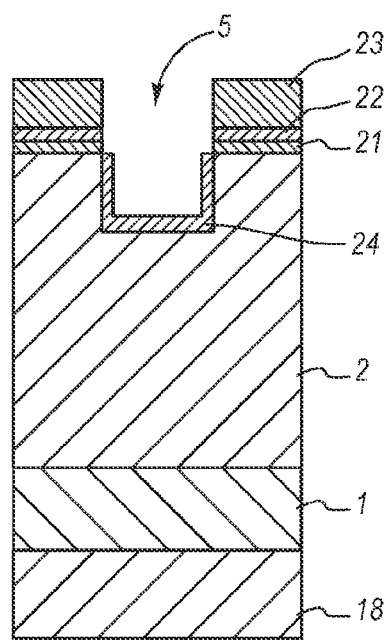
FIG. 6 to FIG. 11 illustrates subsequent steps in a manufacturing method according to an embodiment of the present invention.
Figure 7:
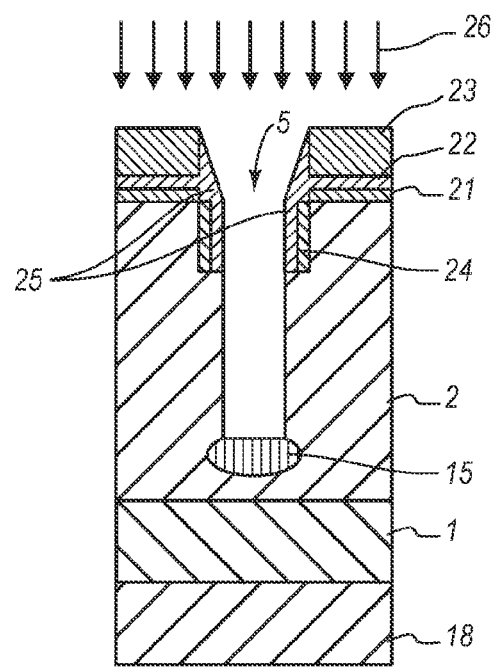

The structure of the semiconductor device 20 according to the present invention may be repetitive and symmetric. This means that on one substrate 18 more than one structure as described above may be formed. The distance between subsequent trenches 5 may typically be 1.6 µm. A further oxide layer 24 may then be grown on the sidewall of the trench 5. The thickness of the further oxide layer 24 may typically be between 10 nm and 50 nm. The structure obtained so far is illustrated in FIG. 6.

In a next step, a nitride layer may be deposited on top of the further oxide layer 24. The thickness of the nitride layer may typically be between 50 nm and 200 nm. The nitride layer may then be etched back anisotropically, leaving nitride spacers 25 on the sidewall of the trench 5. Subsequently, the part of the further oxide layer 24 at the bottom of the trench 5 may be removed by any suitable technique known by a person skilled in the art, for example with a wet etch or a reactive ion etch, with or without the use of a specific mask or series of masks, with an oxide specific etchant or with an etchant that will etch oxide as well as other materials, . . . , and a second etch of the second doped layer 2 may be performed, making the trench 5 deeper. The total depth of the trench 5 depends on the voltage requirements, and thus on the kind of semiconductor device 20 that is made, and may typically be between 1 µm and 25 µm, preferably between 5 µm and 15 µm, for a breakdown voltage of between 50V and 250 V. The width of the trench 5 may preferably be kept as small as possible in order to reduce the area of the semiconductor device 20. Typically, the width/depth ratio may be between 1 and 1/20.

After the trench 5 is formed, according to embodiments to the present invention, optionally an implantation with a p-type impurity, may be performed to create the p-dot layer 15 underneath the trench. This implantation may e.g. be performed with a 0° tilt angle in order not to contaminate the trench sidewall with the p-type dopant. The dopant implantation dose of the p-dot layer may be between $10^{11}$ and $10^{13}$ cm$^{-2}$ and preferably may be between $3·10^{12}$ and $9·10^{12}$ cm$^{-2}$. The implantation of a p-type species is indicated by arrows 26 in FIG. 7.

Figure 8:
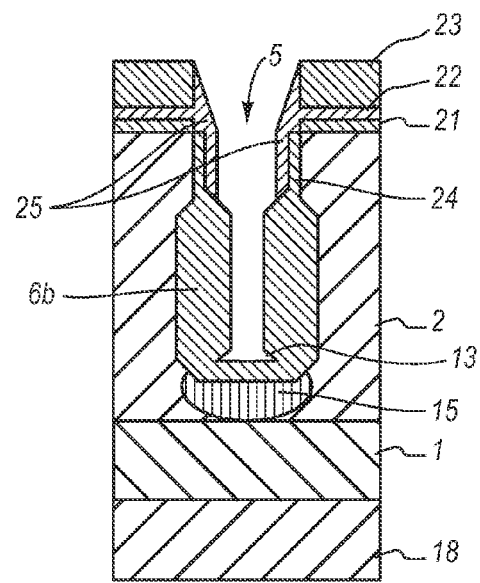

In a next step, a thick oxide 6b may be grown on an inner wall at the bottom of the trench 5. The thickness of the oxide layer 6b may typically be between 400 nm and 1500 nm. During the oxidation step, the top region of the trench 5 is not oxidised as it is protected by the nitride spacer 25. The structure obtained up till now is illustrated in FIG. 8. It can be seen from this figure that, at the bottom of the thick oxide 6b, notches 13 are formed. Formation of the notches 13 is a consequence of the stress present in the first dielectric material grown in the trench 5, e.g. oxide, and of the fact that there may not be sufficient substrate material, e.g. silicon, present at the corners of the trench 5 to grow the first dielectric, e.g. oxide.

Figure 9:
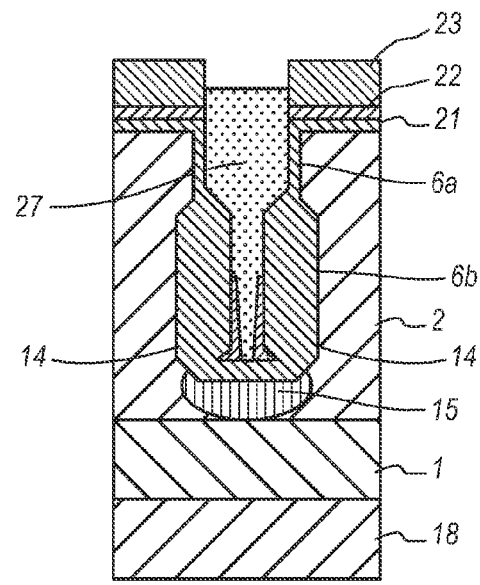

In a next step, the nitride spacers 25 may be removed. This may be done by any suitable technique known by a person skilled in the art. In a further step, nitride spacers 14 may be created at the bottom of the trench 5 on top of the thick oxide 6b in order to increase the breakdown capability of the semiconductor device 20 by filling the notches 13. This may be done by depositing a nitride layer with a thickness between 100 nm and 500 nm and subsequently performing a combination of an isotropic and an anisotropic etch. The thin oxide 6a at the top inner wall of the trench 5 may be formed by oxide layer 24 that was grown just after the first time the trench 5 was etched (see FIG. 6), or can, according to other embodiments be a separately grown oxide, with dedicated thickness. In the latter case, oxide layer 24 first has to be removed. In any case, the thickness of the thin oxide 6a will determine the prime on-state parameters, e.g. Vth, transconductance, Ron, . . . , of the semiconductor device 20. Ideally, the thin oxide 6a may have a high dielectric constant, typically between 4 and 20. The thickness of the thin oxide 6a can range from 5 nm to 100 nm. Subsequently, the remainders of trench 5 may be filled with a suitable material 27, e.g. amorphous silicon with a high doping concentration. The material 27 used to fill the trench 5 may be of the first or second conductivity type. The material that fills the trench 5 may be planarized to the level of the thick oxide layer 23, and may then slightly be etched back. Etching back should stop above nitride layer 22 in order to prevent exposure of the thin oxide 6a. This is illustrated in FIG. 9.

Figure 10:
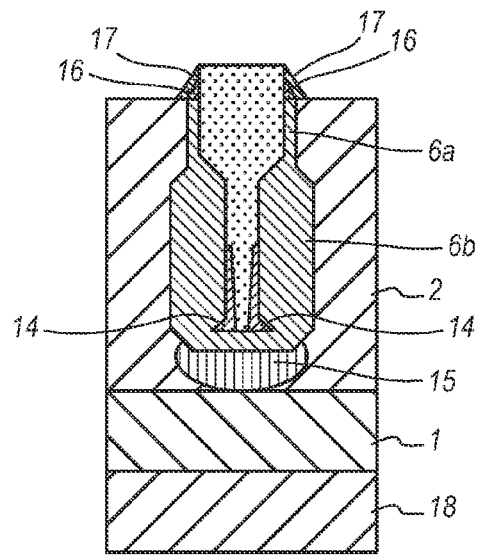
Figure 11:
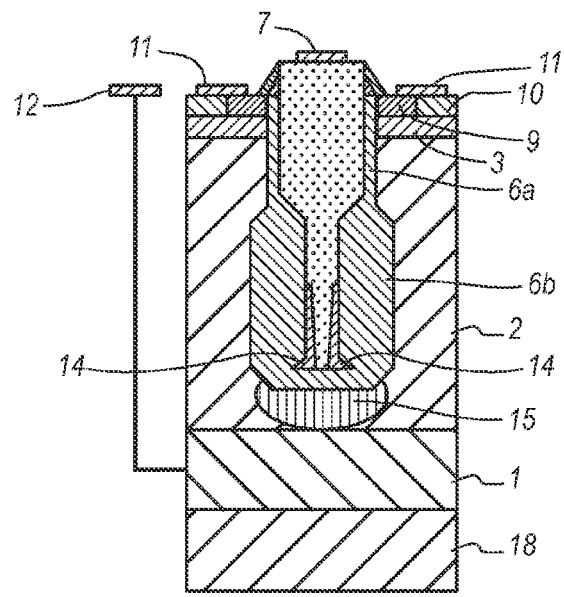

The thin pad oxide 21, nitride layer 22 and thick oxide layer 23 may then be removed. A nitride spacer 16 may be formed by, for example, depositing a nitride layer with a typical thickness between 100 and 200 nm, e.g. with a thickness of 150 nm, which may subsequently be etched anisotropically. The nitride spacers 16 are for preventing the thin oxide 6a from being etched by oxide etching steps during further manufacturing of the semiconductor device 20. This may be the case if, according to the present embodiment, the proposed invention is implemented in a smart power process flow prior to the active area module. Protection of the nitride spacer 16 can be achieved by the formation of an oxide spacer 17 on top of the nitride spacer 16. The oxide spacer 17 may be formed by depositing or growing an oxide layer with a typical thickness of between 10 and 30 nm, e.g. 20 nm, which may subsequently be etched isotropically. Both oxide and nitride spacers 16, 17 are self-aligned to the trench or gate 5. According to other embodiments of the present invention, the oxide spacer 17 may be formed by oxidation of the nitride spacer 16, in that way forming oxynitride which then forms the oxide spacers 17. The result of the above described steps is illustrated in FIG. 10.

Alternatively, the thin oxide 6a can be protected by growing an oxide layer on top of the material the trench 5 is filled with, e.g. gate polysilicon, hence forming a small birds beak at the top of the thin oxide layer 6a. As such, the oxide layer 6a is thicker at the top of the device 20 and less vulnerable.

Next, a p-type channel implant may be performed in order to create a p-type body region or third doped layer 3. This implant may be done unmasked in the regions of interest, hence making the implant self-aligned. The typical concentration of the p-type body or third doped layer 3 may be in the range between $10^{16}$ and $10^{18}$ cm$^{-3}$. The thickness of the third doped layer 3 is preferably not deeper than the length of the thin oxide 6a (see above).

Subsequently, a source connection region 9 and a bulk connection region 10 may be implanted, for example by known methods in CMOS processing. A metal connection for the source contact 11 and for the gate contact 7 may be applied. The drain contact 12 may, according to the present embodiment, be made at the same side as the source and gate contacts. This may be done by connecting the first, highly doped layer 1 with the metal that forms the drain contact 12 by, according to the present embodiment, a highly doped n-type sinker.

It is to be understood that the above-described method of manufacturing is only an example and does not limit the invention in any way. For example, the method may comprise more or less steps or may comprise the same steps but performed in another sequence. Furthermore, other materials than the materials described may be used. For example, the spacers 14 may also be formed of another deposited dielectric material than nitride. Preferably, the deposited dielectric material to form the spacers 14 may have a dielectric constant between 2 and 20. The oxide 6 grown at walls of the bottom part of the trench 5 may also be a nitrided oxide.

It is furthermore to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A semiconductor device comprising: a trench formed into a semiconductor substrate having sidewalls, a bottom, and corners between sidewalls and bottom; a layer comprising a grown first dielectric material covering at least part of the sidewalls and the bottom of the trench, the layer including one or more notches at one or more of the corners of the trench wherein the notch is an indentation that extends into the layer, characterized by: one or more spacers formed of a deposited second dielectric material filling the one or more notches in the layer comprising the grown first dielectric material, whereby the dielectric constant of the deposited second dielectric material is higher than the dielectric constant of the grown first dielectric material.

2. A semiconductor device comprising:
   a first and a second main electrode, a control electrode and a vertical channel
   a stack of doped layers lying in a plane,
   a trench having sidewalls, a bottom, and corners between sidewalls and bottom, the trench being formed in the stack of doped layers in a direction substantially perpendicular to the plane of the stack of doped layers, the trench having a top inner wall and a bottom inner wall;
   a layer comprising a grown first dielectric material covering at least part of the sidewalls and the bottom of the trench, the layer including one or more notches at one or more of the corners of the trench, characterized by:
   one or more spacers formed of a deposited second dielectric material filling the one or more notches in the layer comprising the grown first dielectric material, whereby the dielectric constant of the deposited second dielectric material is higher than the dielectric constant of the grown first dielectric material; and
   the layer comprising the grown first dielectric material at the bottom inner wall of the trench, characterized by:
   the one or more spacers formed of the second dielectric material being located on top of at least part of the layer comprising the grown first dielectric material at the bottom inner wall of the trench.

3. Semiconductor device according to claim 1, wherein the second dielectric material has a dielectric constant between 2 and 20.

4. A semiconductor device according to claim 1, the grown first dielectric material comprising a first part at the top inner wall of the trench and a second part at the bottom inner wall of the trench, the first part being thinner than the second part.

5. A semiconductor device according to claim 2, wherein the stack of doped layers comprises a first doped layer, a second doped layer and a third doped layer.

6. A semiconductor device according to claim 1, wherein the semiconductor device furthermore comprises a floating dot region with the conductivity type of the second doped layer at the bottom of the trench in the second doped layer.

7. A semiconductor device according to claim 4, wherein the semiconductor device furthermore comprises an insulating etch stop on top of the first part of the grown first dielectric material.

8. A semiconductor device according to claim 7, wherein the insulating etch stop comprises a nitride spacer on top of the first part of the grown first dielectric material.

9. A semiconductor device according to claim 8, wherein the insulating etch stop furthermore comprises a protective oxide spacer on top of the nitride spacer.

10. A semiconductor device according to claim 5, wherein a vertical channel is formed between the third doped layer and the first part of the grown first dielectric material in the trench.

11. A semiconductor device according to claim 4, wherein the material of the first part of the grown first dielectric material has a dielectric constant between 4 and 20.

12. A semiconductor device according to claim 4, wherein the second part of the grown first dielectric material has a dielectric constant between 2 and 20.

13. A semiconductor device according to claim 5, wherein the first doped layer and the second doped layer are of a first conductivity type and the third doped layer is of a second conductivity type, the first conductivity type being opposite to the second conductivity type.

14. A semiconductor device according to claim 5, wherein the first doped layer has a higher dopant concentration than the second doped layer.

15. A semiconductor device according to claim 1, wherein the semiconductor device is a power MOSFET.

16. A method for manufacturing a semiconductor device, the method comprising:
   providing a trench extending into a semiconductor material of a semiconductor substrate, the trench having sidewalls, a bottom and corners between the sidewalls and the bottom;

providing a layer comprising a grown first dielectric material on at least part of the sidewalls and the bottom of the trench, the layer including one or more notches at one or more corners of the trench, characterized by:

providing one or more spacers formed of a deposited second dielectric material filling the one or more notches in the layer comprising the grown first dielectric material whereby the dielectric constant of the deposited second dielectric material is higher than the dielectric constant of the grown first dielectric material.

17. A method according to claim 16, the semiconductor device having a first and a second main electrode, a control electrode and a vertical channel, the method comprising:

providing a stack of doped layers lying in a plane and providing the trench in a direction substantially perpendicular to the plane of the stack of doped layers, the trench having a top inner wall and a bottom inner wall;

providing the layer comprising the grown first dielectric material at least part of the inner wall of the trench; and providing the one or more spacers formed of the second dielectric material on top of at least part of the layer comprising the grown first dielectric material.

18. A method according to claim 17, wherein providing the layer comprising the grown first dielectric material at the inner wall of the trench comprises providing a first part of the grown first dielectric at the top inner wall of the trench and providing a second part of the grown first dielectric at the bottom inner wall of the trench, the first part being thinner than the second part.

19. A method according to claim 17, wherein providing a stack of doped layers comprises:

providing a first doped layer of a first conductivity type;

providing a second doped layer of the first conductivity type; and providing a third doped layer of a second conductivity type; and the first conductivity type being opposite to the second conductivity type.

20. A method according to claim 19, wherein providing a third doped layer is performed by implanting a dopant of the second conductivity type in the second doped layer for creating a body region.

21. A method according to claim 16, furthermore comprising:

providing a floating dot region with the conductivity type of the second doped layer at a bottom of the trench in the second doped layer.

22. A method according to claim 18, furthermore comprising providing an insulating etch stop on top of the first part of the grown first dielectric material.

23. A method according to claim 22, wherein providing an insulating etch stop comprises providing a nitride spacer on top of the layer comprising the grown first dielectric material.

24. A method according to claim 23, wherein providing an insulating etch stop furthermore comprises providing an oxide spacer on top of the nitride spacer.

25. A method according to claim 16, furthermore comprising:

providing a second substrate underneath the semiconductor substrate.

\* \* \* \* \*